United States Patent [19]

Kasa

[11] Patent Number: 5,034,927

[45] Date of Patent: Jul. 23, 1991

[54] READ ONLY MEMORY

[75] Inventor: Yasushi Kasa, Kawasaki, Japan

[73] Assignee: Fujitsu Limited, Kawasaki, Japan

[21] Appl. No.: 488,477

[22] Filed: Feb. 27, 1990

Related U.S. Application Data

[63] Continuation of Ser. No. 49,256, May 13, 1987, abandoned.

[30] Foreign Application Priority Data

May 28, 1986 [JP] Japan ............................... 61-122862

[51] Int. Cl.⁵ .............................................. G11C 17/12
[52] U.S. Cl. ............................... 365/230.03; 365/104; 365/189.07; 365/195; 365/230.06
[58] Field of Search ...................... 365/230.03, 230.06, 365/189.07, 195, 94, 104

[56] References Cited

U.S. PATENT DOCUMENTS 4,322,823 3/1982 Pricer et al. ........................ 365/184
4,520,464 5/1985 Hallauer ............................. 365/195
4,617,650 10/1986 Morino et al. ..................... 365/195

Primary Examiner—James W. Moffitt
Attorney, Agent, or Firm—Armstrong, Nikaido, Marmelstein, Kubovcik & Murray

[57] ABSTRACT

A read only memory in which a portion of an address area thereof is allotted to that of another memory. The read only memory comprises at least one address decoding output circuit with a read only memory portion. The address decoding output circuit is formed to be programmable at the same time as the read only memory portion. Thus, an apparatus having this read only memory can be miniaturized and have a low power consumption, and the process of producing a system including this read only memory is simplified.

6 Claims, 7 Drawing Sheets

READ ONLY MEMORY

This application is a continuation of application Ser. No. 049,256, filed May 13, 1987, now abandoned.

BACKGROUND OF THE INVENTION

1) Field of the Invention

The present invention relates to a read only memory (ROM). In particular, it relates to a ROM in which a portion of an address area is allotted to another memory or other memories.

2) Description of the Related Art

In a conventional system, when a portion of a series address area allotted to a ROM (as a whole) is allotted another memory as addresses thereof instead of being allotted to the ROM, an external addition of an address decoding circuit is necessary. The smaller the area occupied by the memory to be allotted, the relatively larger the scale of the address decoding circuit, and this scale expansion causes a corresponding increase in the power consumption of the system. This is because, if the occupied address area of the memory to be allotted is small in comparison with the ROM capacity, a circuit comprising many logical elements becomes necessary for address selection. This invention proposes to solve the above problem.

SUMMARY OF THE INVENTION

An object of the present invention is to provide a ROM comprising an address decoding output circuit with memory elements, which allows a miniaturization of the system to which the ROM is applied, and has a low power consumption. The ROM is produced by simple processes wherein the address decoding output circuit can be programmed by the same method used for the memory elements and the decoder program can be written in the address decoding output circuit corresponding to the state of the ROM simultaneously with the memory setting.

The ROM according to the present invention, in which a portion of an address area is allotted to at least one other memory, comprises a ROM portion and at least one address decoding output circuit.

The ROM portion receives an address signal and outputs the stored data corresponding to the address.

The address decoding output circuit receives the address signal for decoding the address allotted to the other memory, outputs a control signal to the other memory, and disenables the operation of the ROM portion during a period that the control signal is output.

The ROM portion and the address decoding output circuit are programmable, arbitrary address and an arbitrary address capacity can be selected, and the programming method in the address decoding output circuit is the same as that of the ROM portion.

DESCRIPTION OF THE PREFERRED EMBODIMENT

Figure 1:
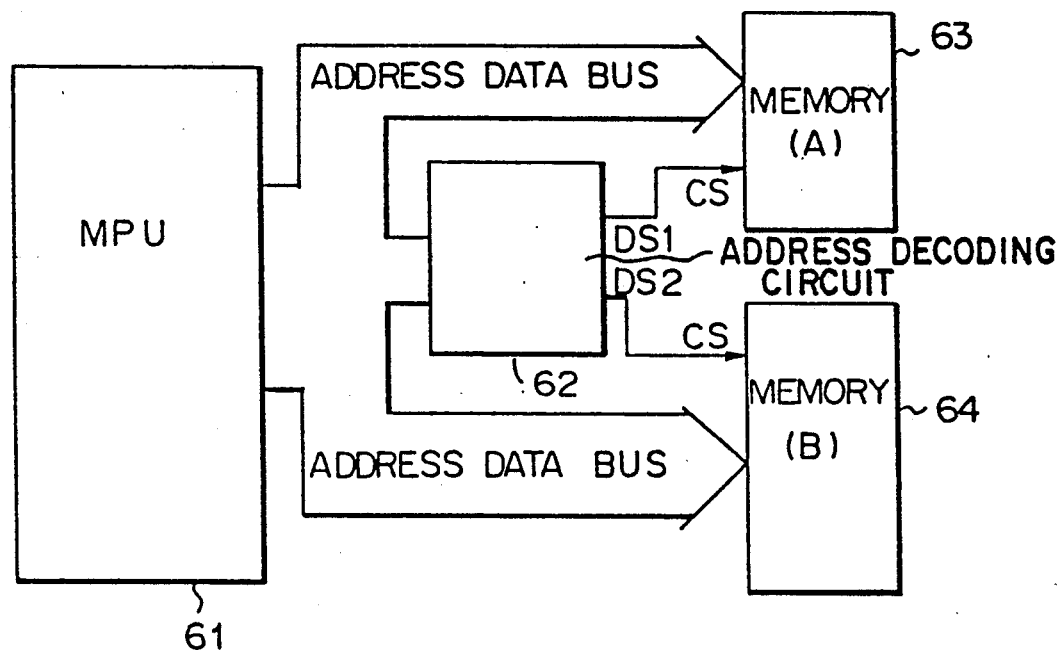
FIG. 1 is a block diagram of a conventional system having a memory in which a portion of an address area is allotted to another memory.
Figure 2:
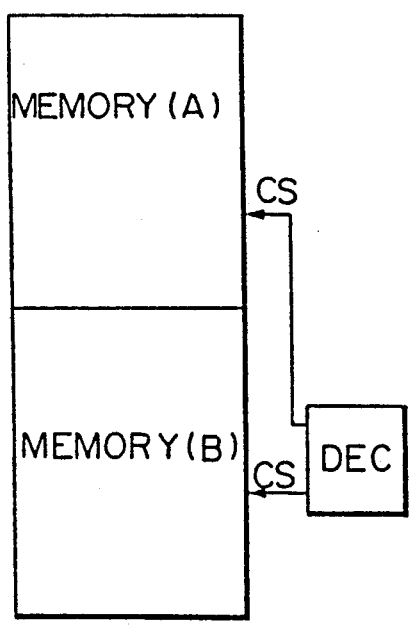
FIG. 2 is a block diagram for explaining an example of an address allotment of the memories in FIG. 1.
Figure 3:
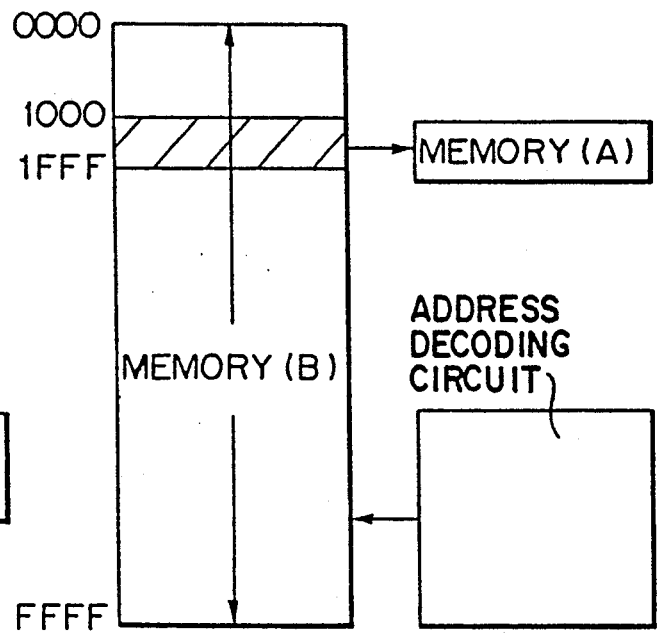
FIG. 3 is a block diagram for explaining another example of an address allotment of the memories in FIG. 1.

Prior to the explanation of the embodiment of this invention, the related art is explained for comparison with reference to FIGS. 1 to 3.

In the prior art, when a portion of an address area of a memory was to be allocated to other memories, an address decoding circuit was necessary outside of the memory. An example of a system including the above-mentioned memories is shown in FIG. 1. In the figure, an address decoding circuit (DEC) 62 is provided between a microprocessor (MPU) 61 and a memory (A) 63 and a memory (B) 64. Each of the memories 63 and 64 and the DEC 62 is provided in an individual chip. The address signals being sent or received between the MPU 61 and each of the memories 63 and 64 are supplied to the DEC 62. Decoding outputs $DS_1$ and $DS_2$ of the DEC 62 are applied to CS (chip selection) terminals of the memories 63 and 64, respectively, as a chip enable signal.

FIG. 2 shows the address area allotted to the memories (A) and (B). The two allotted address areas do not overlap. In this case, the externally added DEC may be a small scale circuit since, for example, the CS signals are obtained by decoding only the upper 1 or 2 bits of the address signal.

On the other hand, as shown in FIG. 3, sometimes the address areas allotted to the memories (A) and (B) overlap, (i.e., a portion of the address area of the memory (B) is allocated to the address of the memory (A), as shown in the figure). It is frequently desirable that the address areas allotted to each memory should overlap. For example, a control microcomputer system needs only a small data memory capacity, but a large memory capacity for program storing. In this case, the allotment as shown in FIG. 3 is necessary to reduce the size of the total system. However, when the address areas allotted to each memory only slightly overlap, the DEC becomes large scale.

Figure 4:
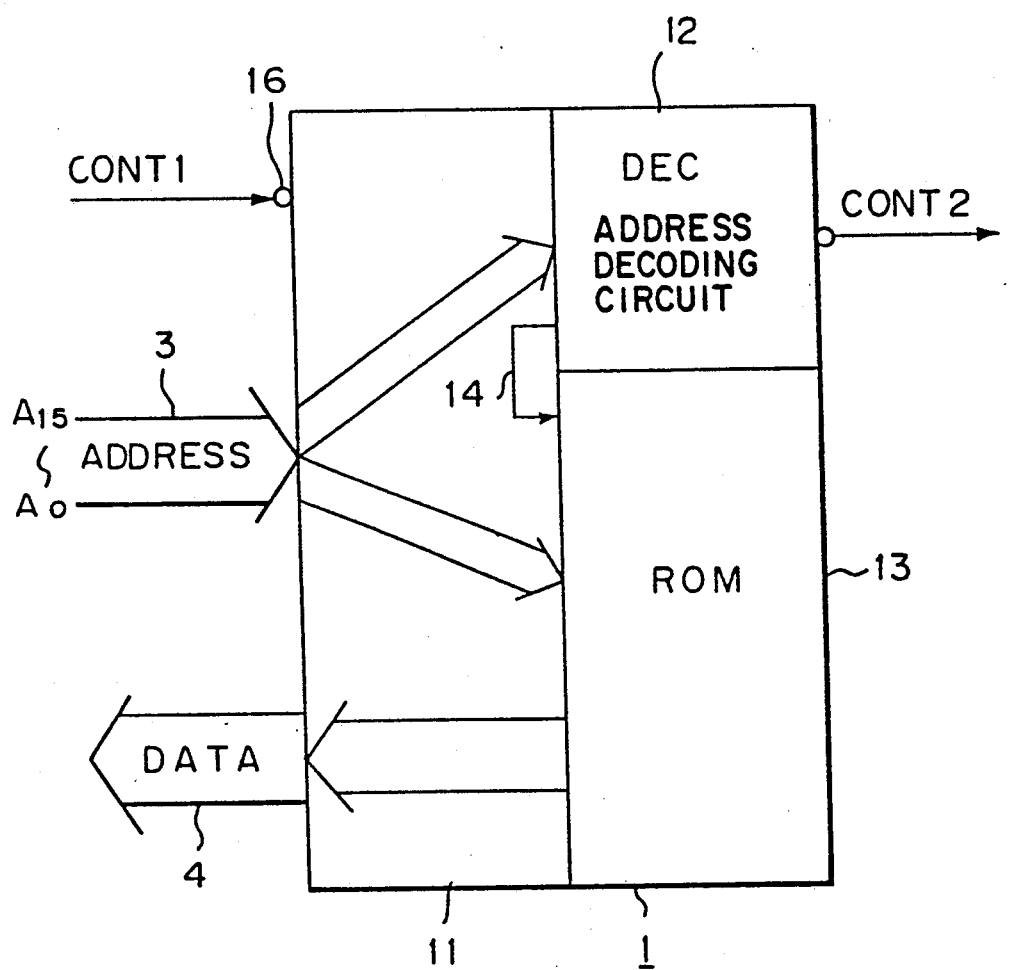
FIG. 4 is a schematic block diagram of a read only memory according to an embodiment of the present invention.

An embodiment according to this invention is explained below with reference to FIGS. 4 to 7. FIG. 4 shows a constitution of a chip 1 of a ROM according to this embodiment. The chip 1 comprises a usual ROM portion 13, an input circuit 11, and an address decoding output circuit (DEC) 12. An MPU (not shown) is connected to the chip 1 through an address bus 3, a data bus 4, and a control signal line (CONT 1). An address signal $A_{15} \sim A_0$ is connected to the usual ROM portion 13 and to the DEC 12.

Figure 5:
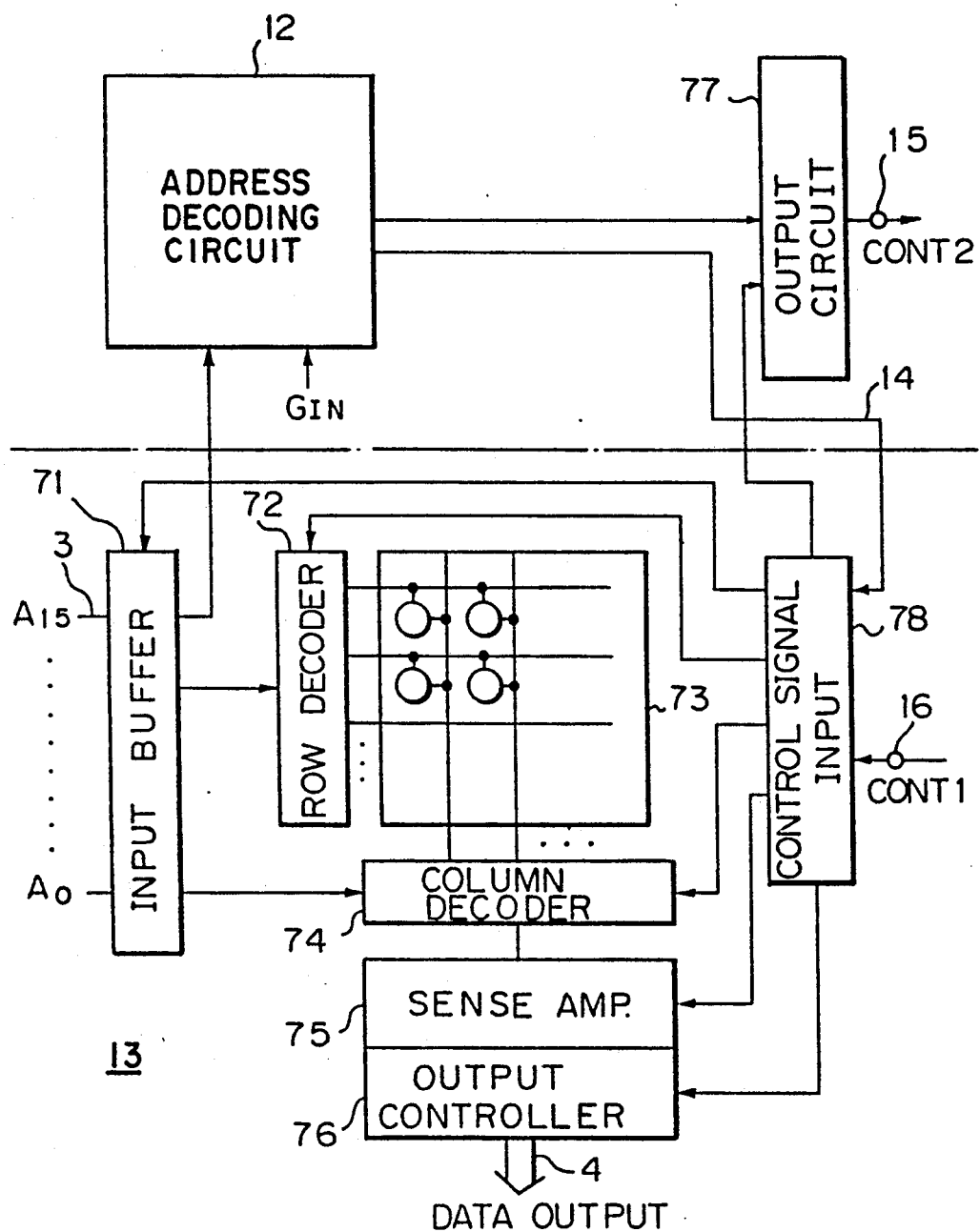
FIG. 5 is a detailed block diagram of the read only memory in FIG. 4.

FIG. 5 shows a detailed block diagram of the ROM portion 13 shown in FIG. 4. The address signal ($A_{15} \sim A_0$) from the address bus 3 is supplied to an input buffer 71, and the output thereof is supplied to a column decoder 74 and a row decoder 72. The output of the input buffer 71 is also supplied to the DEC 12. The upper bit portion of the address is supplied to the row decoder 72 and the lower bit portion of the address is supplied to the column decoder 74. As a result, a memory element (cell) corresponding to the address is selected from a memory element group 73 wherein the memory elements (transistors etc.) are arranged as a matrix. The memory elements are set to one of two states by the production process of a mask ROM or a PROM programming. The programming process is carried out by ion implantation in a transistor, non-forming of the diffusion layer of a transistor, disconnection between the diffusion layer and the aluminum lead wire, and charging of a floating gate of transistor, or the like. The data in the ROM is read out through a sense amplifier 75, and the output is sent to the data bus 4 through an output controller 76. The control signal CONT 1 for the ROM is supplied to a control signal input circuit 78 through a terminal 16. The output of the circuit 78 controls the input buffer 71, the row decoder 72, the column decoder 74, the sense amplifier 75, and the output controller 76.

In addition to the usual ROM portion, the ROM of this embodiment comprises the DEC 12 and an output circuit 77. The DEC 12 receives the address signal from the input buffer 71, and determines whether the address is an address allotted to another memory or an address allotted to the ROM. If the address is that of another memory, the DEC 12 disenables the ROM portion 13 by supplying an internal control signal 14 to the control signal input circuit 78. The DEC 12 also sends the control signal CONT 2 to the external other memory through the output circuit 77 and a terminal 15. In FIG. 5 the ROM portion 13 of FIG. 4 is the portion of FIG. 5 which is below the dot-dash line.

Figure 6:
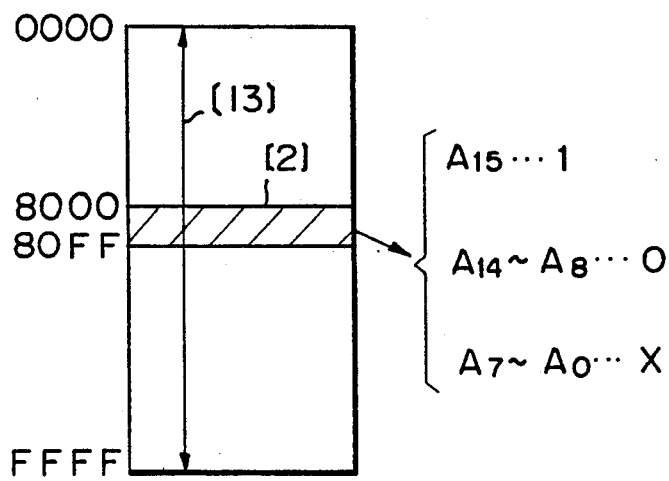
FIG. 6 is an explanatory diagram of an address area allotment in the ROM of FIG. 4.
Figure 7:
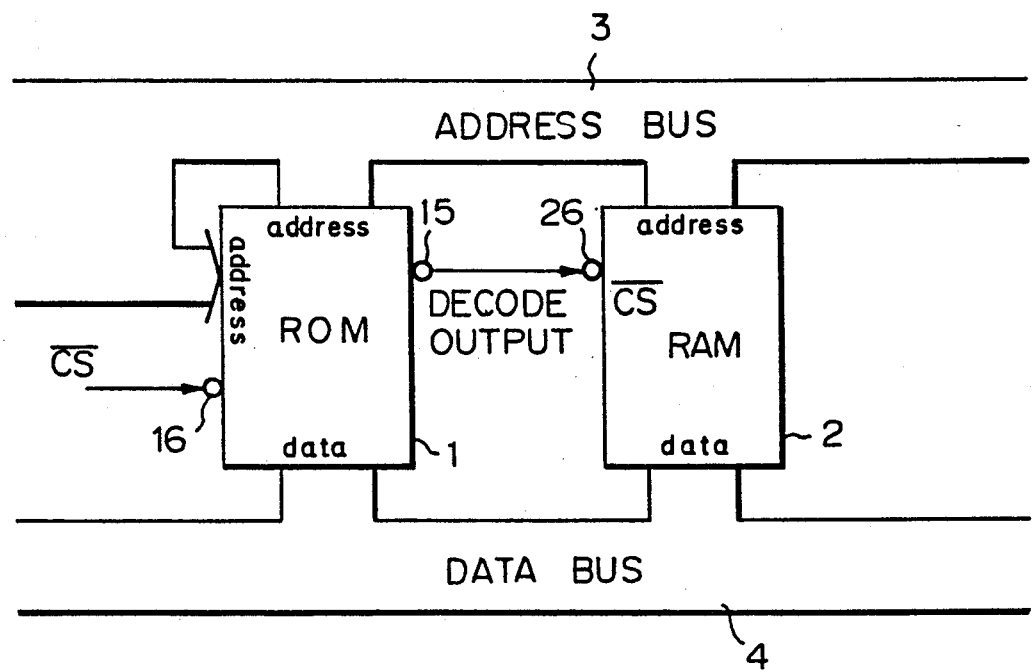
FIG. 7 is a block diagram for explaining the relationship between the ROM of FIG. 4 and the other memory.

As shown in FIG. 6, the following assumption is made in this description. Namely, the address area of the ROM portion in this embodiment is 0000~FFFF as shown by [13] in the figure, and the address area 8000~80FF is allotted to another memory 2 (FIG. 7) as shown by [2] in FIG. 6.

The chip 1 operates in response to the control signal CONT 1 applied to the selection terminal 16 from the MPU. The DEC 12 decodes and outputs the control signal CONT 2 to the other memory 2 through the control output signal terminal 15, when the address signal $A_{15} \sim A_0$ is in the following state. Namely, $A_{15}=1$, $A_{14} \sim A_8=0$, and $A_7 \sim A_0=X$, where X means either 1 or 0. In other words, the address 80XX is 10000000XXXXXXXX in binary expression. The memory 2 is selected by the application of the control signal CONT 2 at a selection terminal 26, and then data is written into a cell having an address indicated by the signal $A_7 \sim A_0$ from the address bus 3, or data is read out from the cell and sent to the data bus 4. The DEC 12 further sends the internal control signal 14 to the ROM portion 13 and brings the output of the ROM portion 13 to a high impedance state.

When the address signal is other than as above-mentioned, the control signal CONT 2 from the DEC 12 is inactive. Therefore, since the other memory 2 is not selected and the inner control signal 14 is not output, the high impedance of the output of the ROM portion 13 is released and the data (or information) stored in the ROM portion 13 is read out and sent to the data bus 4 in response to the address signal $A_{15} \sim A_0$ supplied from the outside.

Figure 8:
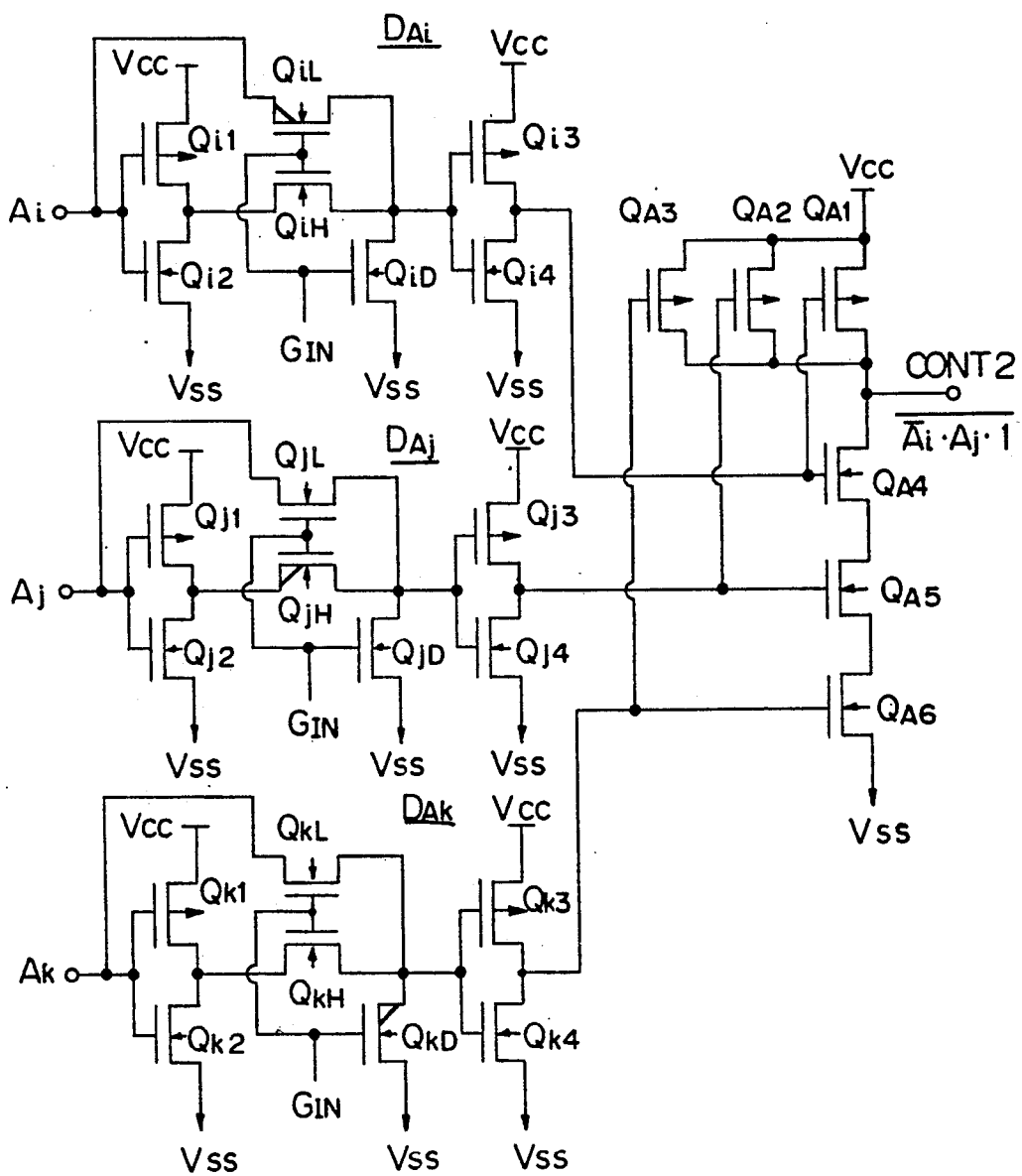
FIG. 8 is a circuit diagram of a partially abbreviated address decoding output circuit in the ROM of FIG. 4; and, FIG. 9, FIG. 10, and FIG. 11 are explanatory diagrams of examples of the use of this invention.

FIG. 8 shows a partial detailed circuit diagram of the DEC 12 which is an important part of this embodiment.

In the figure, a decoding circuit for an address consisting of 3 bits is shown, as an example, to simplify the description. To apply this circuit to the above embodiment, the input address must be 16 bits instead of 3 bits. Each bit of the address signal is expressed as $A_k$, $A_j$, or $A_i$, and decoders $DA_k$, $DA_j$, and $DA_i$ are provided for each bit. Each decoder $DA_k$, $DA_j$, and $DA_i$ comprises inverters at the before and after stages as buffers. In addition, a NAND gate receiving the output of the decoders $DA_k$, $DA_j$, and $DA_i$, and the control output signal CONT 2 is obtained from the output of the NAND gate.

For example, regarding the $A_k$ bit, the decoder $DA_k$ ($Q_{kL}$, $Q_{kH}$, $Q_{kD}$) is provided between a CMOS inverter ($Q_{k1}$, $Q_{k2}$) and a CMOS inverter ($Q_{k3}$, $Q_{k4}$). The result of the decoding of the $A_k$ bit is supplied to a gate of a transistor $Q_{A6}$ of the NAND gate, which comprises load transistors $Q_{A1}$, $Q_{A2}$, and $Q_{A3}$ and transistors $Q_{A4}$, $Q_{A5}$, and $Q_{A6}$ for 3 input gates.

In the circuit of the remaining bits, only the transistors in the decoder portion are programmed by request and the other constitution is the same as that of the $A_k$ bit. The respective decoding results are supplied to the gates of the transistors $Q_{A5}$ and $Q_{A4}$ in the NAND gate.

Examples of the program in the DEC of FIG. 8 are given below.

In the $A_k$ bit, the transistor $Q_{kD}$ is made conductive regardless of the gate input $G_{IN}$ level by ion implantation or the like. The other transistors $Q_{kL}$ and $Q_{kH}$ are programmed to be non-conductive by the application of a low level at the gates. Transistors having a slanting line drawn at a corner of the symbol therefor are programmed to be conductive. If the input level $G_{IN}$ of the gates is fixed to a low level, the output of the decoder $DA_k$ is always low level regardless of the level of the address input. The low level at the output is inverted through the inverter ($Q_{k3}$, $Q_{k4}$) and becomes a high level. The $G_{IN}$ input is determined to be a high or low level by programming.

In the $A_j$ bit, the transistor $Q_{jH}$ is made conductive and the other transistors $Q_{jL}$ and $Q_{jD}$ are programmed to be non-conductive. Therefore, the address input $A_j$ is output as it is by the double inversion carried out by the inverter ($Q_{j1}$, $Q_{j2}$) and the inverter ($Q_{j3}$, $Q_{j4}$).

In the $A_i$ bit, the transistor $Q_{iL}$ is made conductive and the other transistors $Q_{iH}$ and $Q_{iD}$ are programmed to be non-conductive. The address input $A_i$ is inverted through the inverter ($Q_{i3}$, $Q_{i4}$) and the inverted output of the address $A_i$ is supplied to the gate of the transistor $Q_{A4}$ in the NAND gate. In FIG. 8 $V_{CC}$ and $V_{SS}$ are a positive terminal and a negative terminal of the power source, respectively. In FIG. 8, the transistors $Q_{i1}$, $Q_{j1}$, $Q_{k1}$, $Q_{i3}$, $Q_{j3}$, $Q_{k3}$, $Q_{A1}$, $Q_{A2}$, and $Q_{A3}$ are P channel type MOS transistors, and the transistors $Q_{i2}$, $Q_{j2}$, $Q_{k2}$, $Q_{i4}$, $Q_{j4}$, $Q_{k4}$, $Q_{iL}$, $Q_{jL}$, $Q_{kL}$, $Q_{iH}$, $Q_{jH}$, $Q_{kH}$, $Q_{iD}$, $Q_{jD}$, $Q_{kD}$, $Q_{A4}$, $Q_{A5}$, and $Q_{A6}$ are N channel type MOS transistors.

Therefore, the logical expression of the control output signal of the DEC in FIG. 8 is $\overline{A_i} \cdot A_j \cdot 1/$.

When the DEC 12 for 16 bits, as shown in FIG. 6, is necessary, the address input 10000000XXXXXXXX must be decoded. In this case the above-mentioned individual decoder circuits are used as follows.

The decoder for A15 has the same program as that of the decoder of the $A_j$ bit shown in FIG. 8, so that the level of the address signal output is left as it is.

The decoders for $A_{14} \sim A_8$ have the same program as that of the decoder of the $A_i$ bit shown in FIG. 8, so that an inverted signal of the address signal is output.

The decoders for $A_7 \sim A_0$ have the same program as that of the decoder of the $A_k$ bit shown in FIG. 8, so that a high level is always output regardless of the address input signal.

In the above exemplified DEC, the three transistors of the decoder are programmed to be conductive or non-conductive by the same programming process as used for the ROM portion. Therefore, when information is written into the ROM, the decoder program can be written simultaneously in response to the ROM information. At that time, for the mask ROM, the programming of the ROM and the programming of decoder are carried out with only one mask sheet.

In the above embodiment, an example of one overlap of the address areas is disclosed. However, a plurality of overlaps between the ROM address area and the address areas of the other memories is possible. The plurality of address areas are decoded by the DEC, and the address areas can be allotted to a plurality of other memories. In the above embodiment, only one DEC 12 is used, but a plurality of DEC's can be provided. The outputs from the DEC's are operated with a logical product or logical sum and an arbitrary portion of the address area can be replaced for the other memories.

Figure 9:
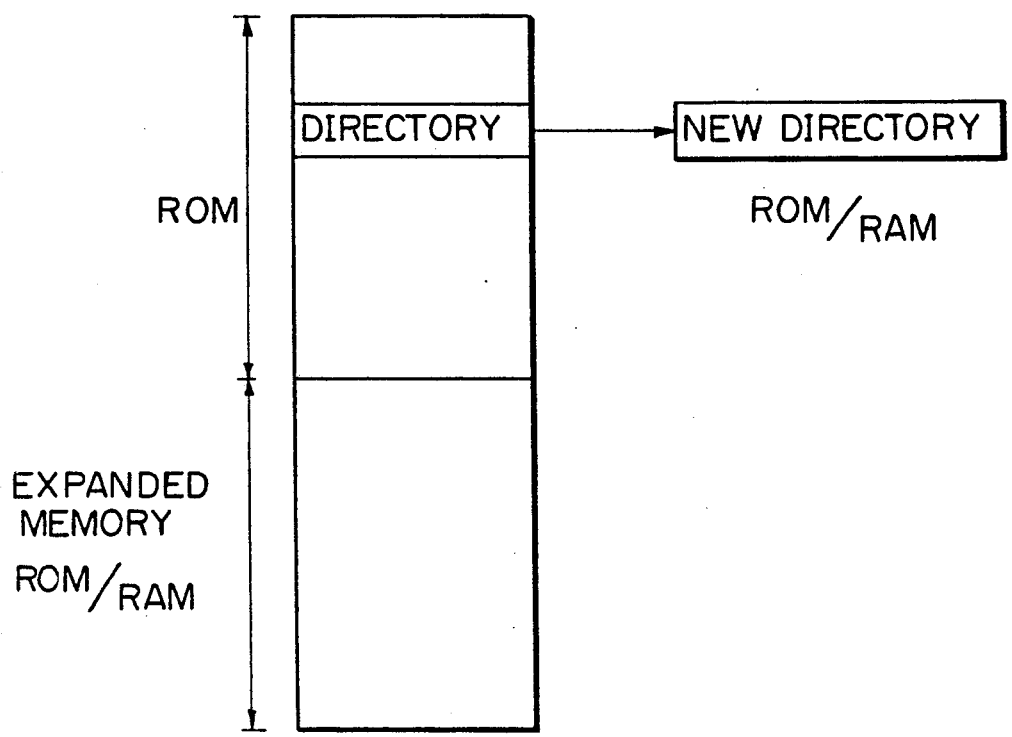
Figure 10:
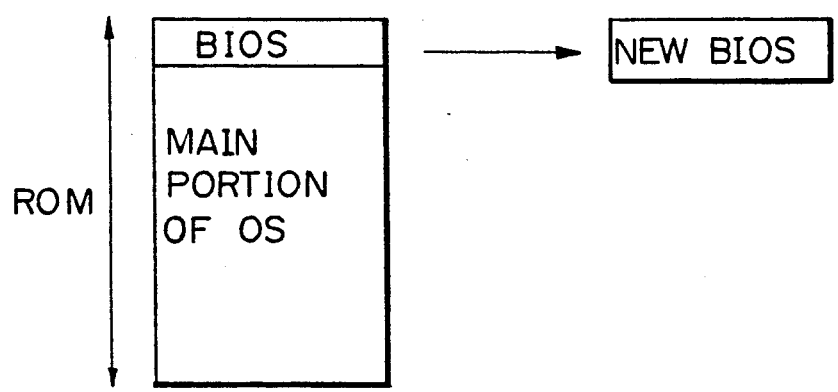
Figure 11:
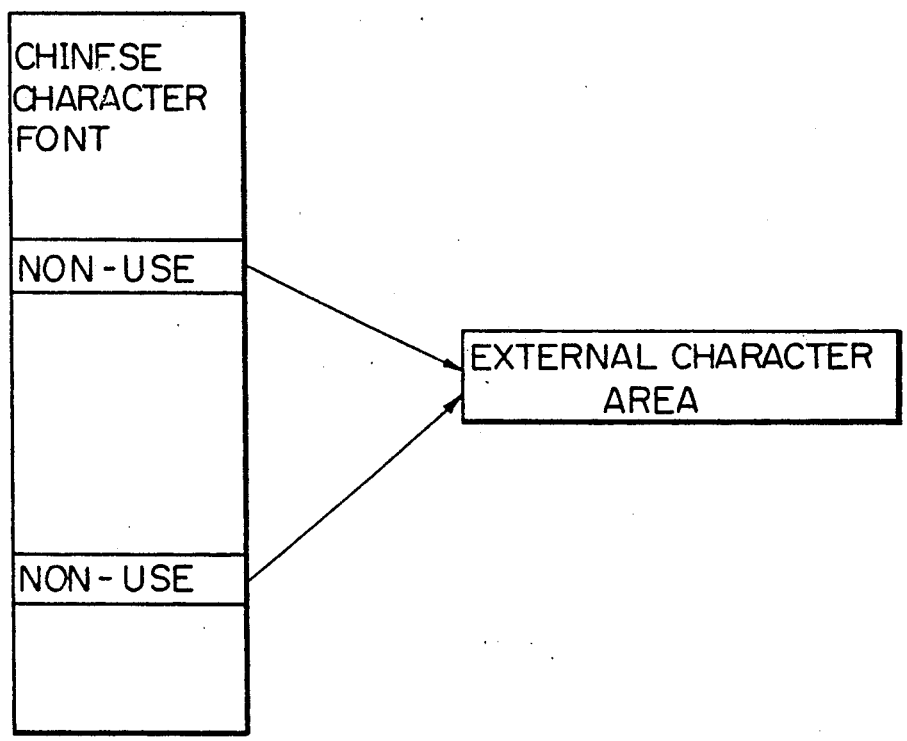

FIGS. 9 to 11 show examples of the application of this invention.

FIG. 9, shows an operating system (OS) of a microcomputer formed by ROM's. This structure is used in an apparatus using a memory disk. If the directory storage portion in the ROM is replaced with another memory such as a ROM or a RAM, the change of the directory is easily realized and the fields of application increased.

FIG. 10 shows a BIOS (Basic Input Output System), which is a portion depending on an apparatus type in the operating system, replaced by comparatively small capacity EPROM (erasable programmable read only memory) or mask ROM, to enable the operating system to cope with various kinds of apparatus. This application is advantageous in that a development of a large mask ROM is not needed for each apparatus. As a result, the time necessary to develop a new type of apparatus can be shortened and the developing costs reduced. A general purpose ROM system can be developed for use in a Chinese character portion of a Japanese language program by the application of this invention.

In FIG. 11 shows another application as a Chinese character portion, wherein a memory portion (non-use) for a portion of an internal character which is not frequently used for the present purpose is replaced with another memory for an external character area used frequently for a special purpose. The frequently used general characters belong to the internal character and the external character is not included in the internal character, and are used for special purposes.

I claim:

1. A read only memory device comprising:
a read only memory portion receiving an address signal and supplying stored data in response to the address signal; and
an address decoding output circuit connected to said read only memory portion, said address decoding output circuit supplying a control signal to said read only memory portion to disable said read only memory portion when a predetermined address is detected and said address decoding output circuit supplying said control signal outside of said read only memory device to an external device to control said external device when said predetermined address is detected, wherein said read only memory portion and said address decoding output circuit are formed on a single chip and are programmable, said address decoding output circuit comprises decoders which are programmable logic circuits to be programmed to one of a circuit outputting the address signal, a circuit outputting the inverted address signal, and a circuit outputting a fixed level signal regardless of the address signal, and a logical gate for receiving the outputs of said decoders.

2. A read only memory as set forth in claim 1, wherein said decoder comprises a first inverter, a second inverter, a first transistor connected between the input of the first inverter and the input of the second inverter, a second transistor connected between the output of the first inverter and the input of the second inverter, and a third transistor connected between the input of the second inverter and a power source, the gates of the first, second, and third transistors being supplied with a gate input signal, and one of the first, second, and third transistors being programmed to be conductive regardless of the gate input signal.

3. A read only memory as set forth in claim 1, wherein said address decoding output circuit is programmed simultaneously with said read only memory portion by connection or disconnection of transistors therein using a mask read only memory production process.

4. A read only memory as set forth in claim 1, wherein said address decoding output circuit is programmed simultaneously with said read only memory portion by ion implantation of transistors therein using a mask read only memory production process.

5. A read only memory as set forth in claim 1, wherein said address decoding output circuit is programmed simultaneously with said read only memory portion by forming or not forming a diffusion area in transistors therein using a mask read only memory production process.

6. A read only memory as set forth in claim 1, wherein said address decoding output circuit is programmed simultaneously with said read only memory portion by positive or negative charging of a floating gate of transistors therein using a programmable read only memory production process.

* * * * *